United States Patent [19]

Riley

[11] 4,400,256
[45] Aug. 23, 1983

[54] METHOD OF MAKING LAYERED SEMICONDUCTOR LASER

[76] Inventor: Leon H. Riley, 7707 Logan Dr., Huntsville, Ala. 36802

[21] Appl. No.: 332,263

[22] Filed: Dec. 18, 1981

[51] Int. Cl.³ .............................................. C23C 15/00
[52] U.S. Cl. .............................. 204/192 S; 204/192 C; 29/583; 357/20; 372/43; 372/44
[58] Field of Search .................... 204/192 S, 192 C; 29/583; 372/43, 44–47; 357/20

[56] References Cited

U.S. PATENT DOCUMENTS

| | | | |
|---|---|---|---|
| 3,359,508 | 12/1967 | Hall | 372/44 |
| 3,939,052 | 2/1976 | Riley | 204/192 |
| 4,140,610 | 2/1979 | Morimoto | 204/192 N |
| 4,152,535 | 2/1979 | Deminet et al. | 136/258 PC |

*Primary Examiner*—Aaron Weisstuch
*Attorney, Agent, or Firm*—Robert P. Gibson; Anthony T. Lane; James T. Deaton

[57] ABSTRACT

A method for making a thin film layered semiconductor laser which includes depositing layers of semiconductor and electrical lead materials on an undoped semiconductor substrate and heating each layer of the semiconductor material after it has been deposited to improve crystallinity of the deposited semiconductor material and to improve interfaced continuity of the material at the lasing interface and at the electrical conductor to semiconductor interface, and after the desired number of layers of semiconductor and electrical lead materials have been deposited, cutting and polishing the ends of the laser device and finally placing a non-conductive dielectric reflecting surface on one of the polished end surfaces of the laser.

5 Claims, 14 Drawing Figures

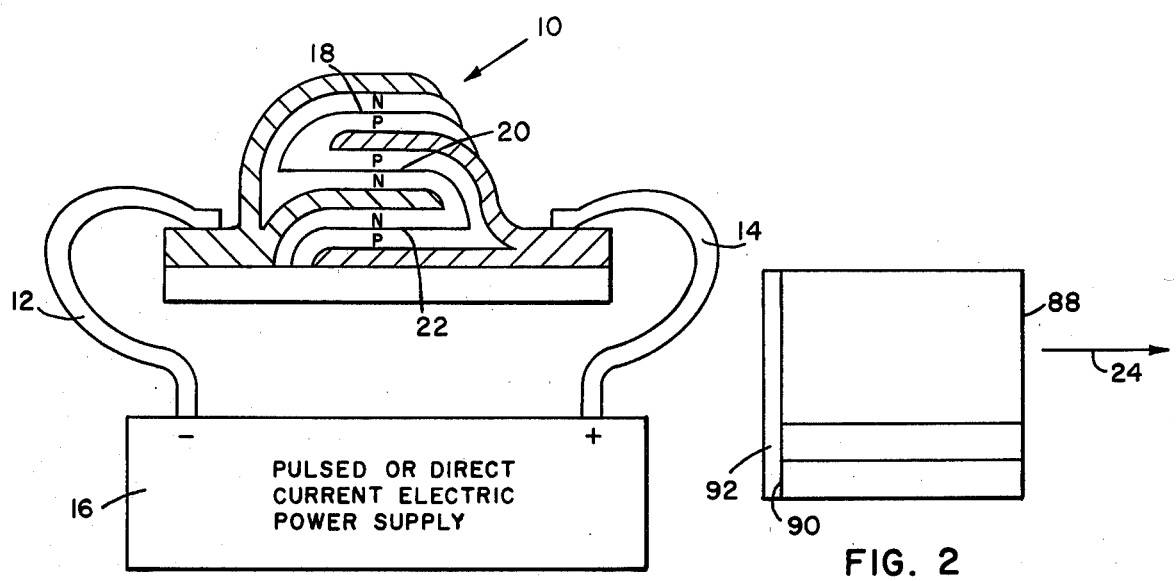
FIG. 1
FIG. 2
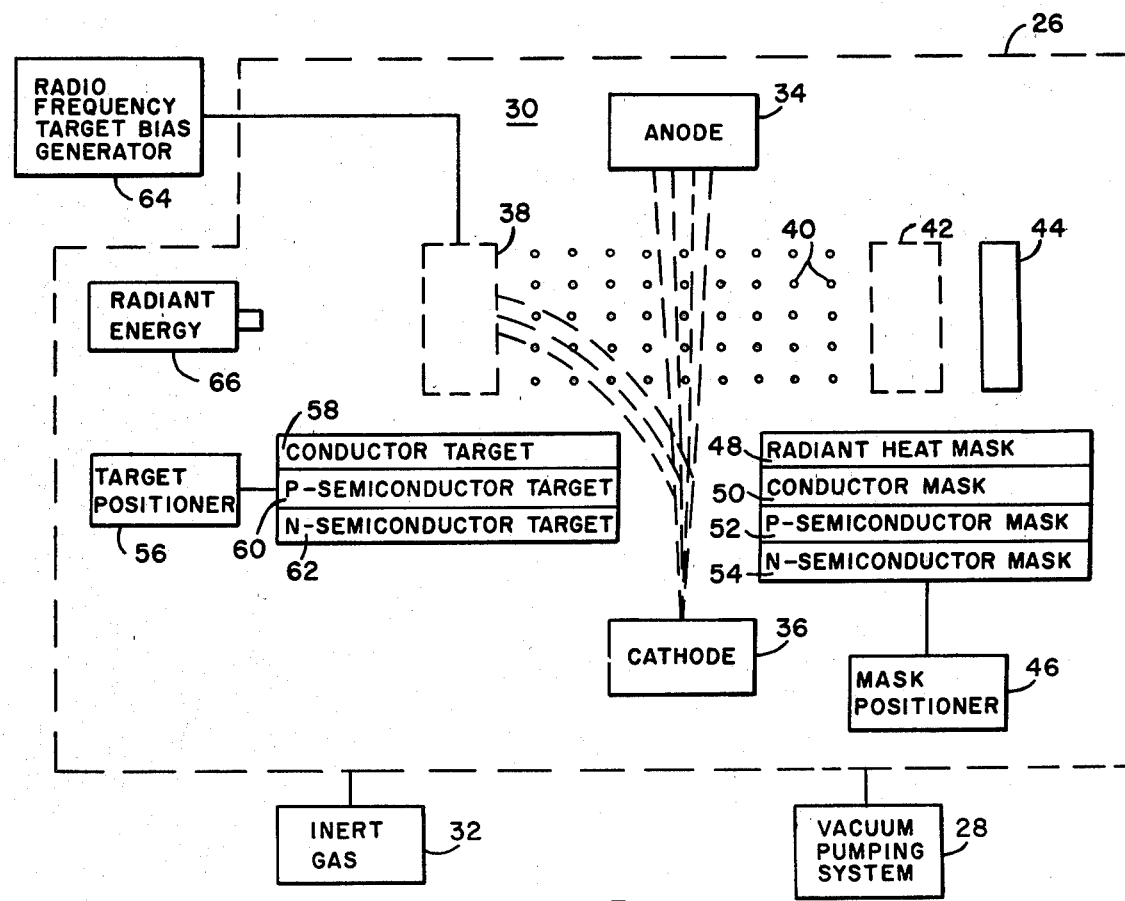
FIG. 3

METHOD OF MAKING LAYERED SEMICONDUCTOR LASER

DEDICATORY CLAUSE

The invention described herein may be manufactured, used, and licensed by or for the Government for governmental purposes without the payment to me of any royalties thereon.

CROSS REFERENCE TO RELATED APPLICATION

This application is related to applicant's co-pending application Ser. No. 332,264 filed Dec. 18, 1981. This application is related to applicant's co-pending application in that the co-pending application discloses a layered semiconductor laser which can be made in accordance with the method disclosed in this application.

BACKGROUND OF THE INVENTION

Present semiconductor lasers have a thin lasing region. This thin region limits the output power and its beam divergence angle. The following formula relates laser diffraction-limited beam divergence angle to the output diameter of a lasing surface and its lasing wavelengths.

$$\theta = 2.44\lambda/d$$

Where
$\theta$ = radians
$\lambda$ = Wavelength (meters)
d = diameter of lasing surface (meters)

For present semiconductor lasers $\theta$ becomes large as a result of d being extremely small.

An array of present semiconductor lasers can be formed, but the physical size of the lasers limit the diameter of the lasing area. The lasing area is inefficiently scattered over the array and does not provide for concentrated laser light emission or a small diffraction-limited beam divergence angle. Therefore, there is a need for a method of making a layered semiconductor laser so that semiconductor lasing functions take place coherently over a large number of semiconductor junctions in a homogeneous manner.

Therefore, it is an object of this invention to provide a method by which a layered semiconductor laser can be made to provide a larger lasing area than presently available in semiconductor laser devices.

Another object of this invention is to provide a method of making a semiconductor laser device which has a smaller beam divergence angle than those of the present semiconductor laser devices due to the fabrication of the semiconductor lasers.

Still another object of this invention is to provide a method of making a semiconductor laser device that results in a laser that has a larger lasing area and thereby provides a higher power output capability.

Still another object of this invention is to provide a method of making a layered semiconductor laser in which the electrical leads are internal to the lasing volume of semiconductor material to provide increased laser efficiency by providing increased heat removal and low current losses.

Other objects and advantages of this invention will be obvious to those skilled in this art.

SUMMARY OF THE INVENTION

In accordance with this invention, a method of making a semiconductor diode laser device is provided which includes providing an undoped semiconductor substrate, sputtering a first conductor on a portion of the surface of the undoped semiconductor substrate, sputtering a layer of a semiconductor material such as a P type over a portion of the conductor layer, heating a portion of the sputtered semiconductor material with radiant heat to improve crystallinity and inner surface continuity of the semiconductor laser layer, sputtering a layer of a different semiconductor material over the first layer of semiconductor material and then heat treating the lasing surface of the second layer of sputtered material for depositing a conductor layer over the second layer of semiconductor material in a separate portion of the semiconductor substrate, then repeating each of the layers as specified until the desired number of layers of semiconductor material and conductors are provided with each of the semiconductor layers being heat treated to provide a multiplicity of stacks of semiconductor junctions. After the predetermined number of layers have been deposited by the sputtering technique and heat treated with the radiant heat, the laser has opposite ends that are cut to provide a smooth surface which is then polished in a conventional manner to provide polished ends of the laser. One of the laser ends has a non-conductive dielectric reflecting surface secured thereto in a conventional way to complete the fabrication of the thin film layered semiconductor diode laser device.

BRIEF DESCRIPTION OF THE DRAWINGS

FIG. 1 is a sectional view of the semiconductor laser in accordance with this invention and illustrating the connection thereof to a power supply, FIG. 2 is a side view of the semiconductor laser, FIG. 3 is a schematic illustration of a triode sputtering arrangement with radiant heat source for carrying out the method for making the layered semiconductor laser.

DESCRIPTION OF THE PREFERRED EMBODIMENT

Referring now to FIG. 1, a layered semiconductor laser 10 in accordance with this invention is illustrated and includes an interconnection by leads 12 and 14 to a pulse or direct current electrical power supply 16. This invention provides for closely spacing of semiconductor lasing functions so that lasing takes place coherently over a large number of semiconductor junctions in a homogeneous manner as illustrated at N-P junctions 18, 20, and 22. As illustrated, the invention provides for thin layers of the semiconductor diodes. The thickness of each semiconductor diode layer is normally, but not always, limited to less than 1/10 of the lasing wavelength of the semiconductor diode material. The utilization of the about 1/10 or less spacing reduces phase differences between lasing layers or junctions such that the light emitting from all layers adds in phase to provide a uniform phase front as the light leaves the layers of semiconductor material as schematically illustrated at 24 in FIG. 2. Typical semiconductor material of which the N and P type layers are made is gallium arsenide. Typical P type material is zinc doped and typical N type material is tellurium doped. A light emission of this material is at 0.84 microns and a 1/10 wavelength is 0.084 microns. Any of the other currently known semiconductor materials and dopants may also be used in the method of producing a layered diode laser as set forth in this disclosure. The conductor leads that sandwich each laser junction are also made thin like each layer of the semiconductor laser and of materials that are known in the art such as silver, gold, aluminum, copper and tungsten. The specific material of the lead to be used in the diode will be selected in accordance with the particular application to which the laser diode is to be applied or used. The semiconductor material is made very thin as set forth so that light is emitted throughout the semiconductor material and the conductor material is also made thin so that some light will pass through the conductor and so that the physical geometry of the laser is not seriously affected.

Figure 4:
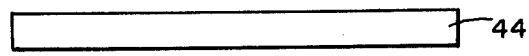
FIG. 4 illustrates the starting substrate.

Referring now to FIG. 3, a manufacturing method of making the layered semiconductor laser device is schematically illustrated and includes a vacuum enclosure 26 with a vacuum pumping system 28 for evacuating chamber 30 of enclosure 26 and an inert gas supply 32 for back-filling to the proper pressure of chamber 30 with the inert gas. Enclosure 26 also has conventional anode and cathode 34 and 36 respectfully mounted in enclosure 26 in a conventional manner with appropriate voltages applied between cathode 36 and anode 34 at the appropriate time with the anode and cathode 34 and 36 forming with an appropriate target at target position 38 a triode sputtering arrangement for sputtering particles as illustrated at 40 toward a mask position 42 in the particular opening in a mask to an undoped semiconductor substrate 44 as illustrated in detail in FIG. 4. A mask positioner 46 is provided for selectively positioning masks 48, 50, 52 and 54 into position 42 for depositing the indicated layers on substrate 44. A target positioner 56 is provided for positioning targets 58, 60 and 62 into target position 38 for the sputtering of the respective target material toward substrate 44. When the particular target is positioned in target position 38, a radio frequency target bias generator source 64 is connected to the target mounted at position 38 to complete the triode arrangement. A radiant energy source 66 such as a laser source is mounted in enclosure 26 to provide a heat source for radiating heat through mask 48 when mounted in position 42 for treating each layer of the N and P type materials just after each layer is deposited.

Figure 5:
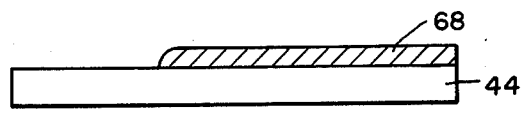
FIG. 5 illustrates the substrate with the first conductor layer sputtered thereon.
Figure 6:
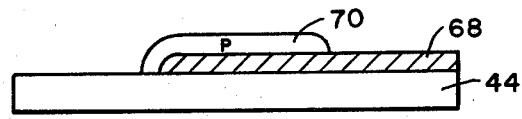
FIG. 6 illustrates the next step of sputtering the P type material thereon.
Figure 7:
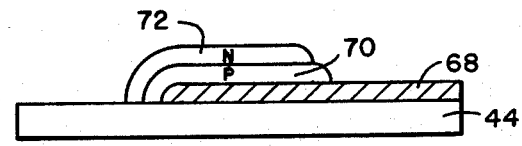
FIG. 7 illustrates the next step of depositing the first layer of N type material.
Figure 8:
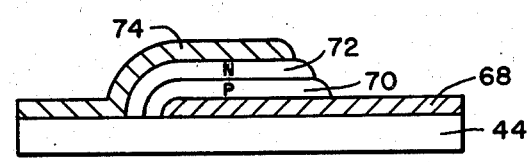
FIG. 8 illustrates the step of depositing the second conductor.
Figure 9:
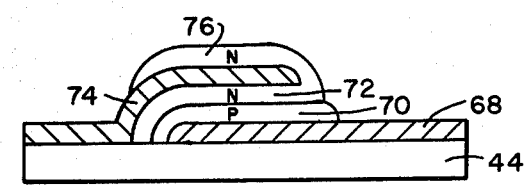
FIG. 9 illustrates the depositing of the second N type semiconductor layer over a portion of the second conductor.
Figure 10:
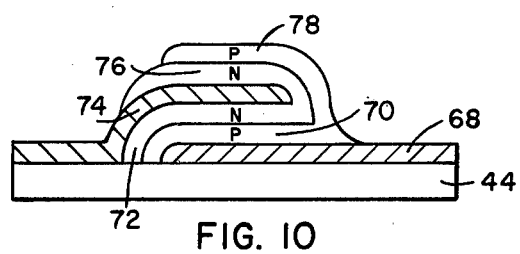
FIG. 10 illustrates the step of depositing the second P type layer over the second N type layer.
Figure 11:
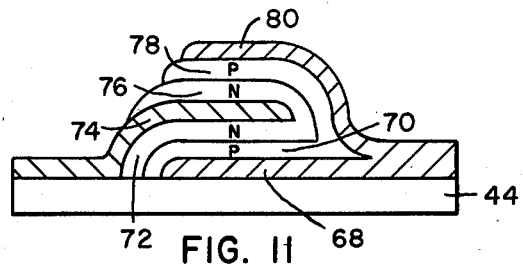
FIG. 11 illustrates the step of depositing the third conductor layer over the second P type layer.
Figure 12:
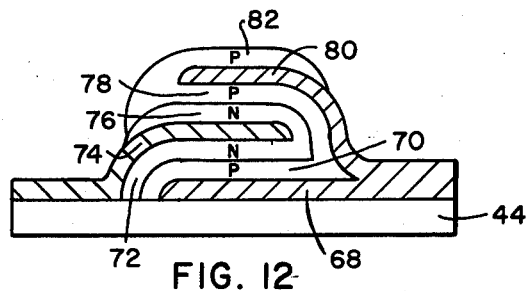
FIG. 12 illustrates the depositing of the third P type layer over the third conductor layer and also illustrates the interconnection of the three P type layers.
Figure 13:
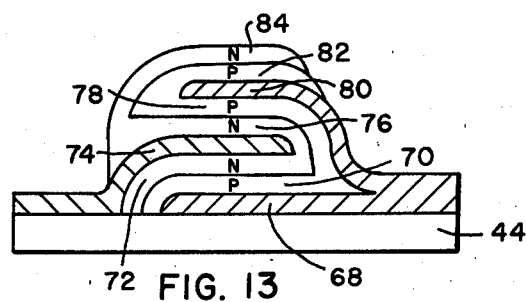
FIG. 13 illustrates the depositing of the third N type layer over the third P type layer with the interconnection of the three N type layers.
Figure 14:
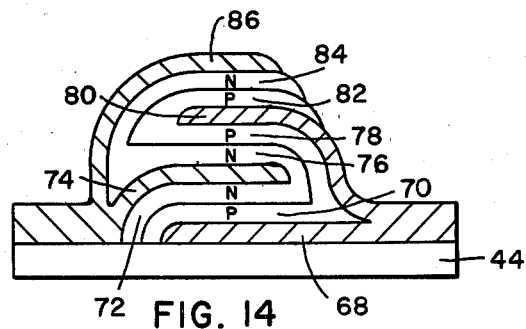
FIG. 14 illustrates the depositing of the forth conductor layer over the third N type semiconductor layer and over a portion of the second conductor layer.

In carrying out the method sequence, vacuum enclosure 26 is first evacuated by vacuum pump system 28 and then backfilled to the appropriate pressure in chamber 30 with inert gas 32. With the appropriate potential applied across cathode 36 and anode 34 and with substrate 44 positioned as illustrated, with electrical conductor mask 50 positioned at 42, with conductor target 58 positioned at 38 and connected to radio frequency target bias generator 64, conductor metal is sputtered through appropriate opening in conductor mask 50 onto substrate 44 to deposit an electrical conductor 68 as illustrated in FIG. 5. Next, mask positioner 46 is used to replace electrical conductor mask 50 by P semiconductor mask 52 into position 42 and target positioner 56 removes conductor target 58 and replaces it with semiconductor target 60. Material is then sputtered from P semiconductor target 60 through the opening in P semiconductor mask 52 to substrate 44 to deposit P semiconductor layer 70 as illustrated in FIG. 6. Target positioner 56 then removes P semiconductor target 60 from position 38 and mask positioner 46 removes P semiconductor mask 52 from position 42 and places radiant heat mask 48 in position 42 for heat treating of P semiconductor layer 70. Radiant heat mask 48 is made of a high melting point material such as tungsen and is provided with an opening for treating the flat upper surface of the P type material. With radiant heat mask 48 positioned relative to the P type material, radiant energy source 66 is used to heat P semiconductor material 70 to or about its melting point to improve crystallinity and interface continuity of this layer of P semiconductor material 70 with conductor 68 and also with the subsequent layer of semiconductor material to be deposited. The specific temperature to which the layer of P semiconductor material is heated will depend upon the particular P type semiconductor material used. Next, mask positioner 46 removes radiant heat mask 48 and replaces it with semiconductor mask 54 and target positioner 56 moves N type semiconductor target 62 into target position 38. With the appropriate potential across anode 34 and cathode 36 and with N semiconductor target 62 connected to radio frequency target bias generator 64, N type semiconductor material is sputtered from the N semiconductor target and through opening in N semiconductor mask 54 and onto substrate 44 and over P semiconductor 70 as N semiconductor layer 72 as illustrated in FIG. 7. With N semiconductor layer 72 deposited, N semiconductor target 62 is removed from target position 38 by target positioner 56 and N semiconductor mask 54 is replaced with radiant heat mask 48 by mask positioner 46. Radiant energy source 66 is then used to heat N semiconductor layer 72 at the flat top surface to improve the crystallinity and inner surface continuity to improve the layer of the N type layer in the same manner as the P layer was treated with the heat energy. Next, target positioner 56 positions conductor target 58 in position 38 with the target positioner connected to radio frequency target bias generator 64 and mask positioner 46 replaces radiant heat mask 48 with electrical conductor mask 50 and positions electrical conductor mask 50 to allow metal to be sputtered from target conductor 58 through the opening of electrical conductor mask 50 and deposit electrical conductor 74 over N semiconductor 72 as illustrated in FIG. 8. When the predetermined thickness of conductor 74 has been completed, target positioner 56 replaces conductor target 58 with N semiconductor target 62 and mask positioner 46 replaces electrical conductor mask 50 with N semiconductor mask 54. With all elements in position and connected, metal is again sputtered from N semiconductor target 62 at position 38 through the N semiconductor mask opening onto substrate 44 and deposited as layer 76 as illustrated in FIG. 9. It is pointed out that when layer 76 is deposited this layer overlaps with a portion of layer 72 to provide an integral inner connection of N layer 72 with N layer 76. N semiconductor layer 76 is then heat treated in the same way as described for layer 72 and then the target and mask are positioned and cause depositing of P semiconductor layer 78 as illustrated in FIG. 10. When P layer 78 is deposited, it overlaps with the first deposited P layer 70 to provide an integral and continuous connection of the P materials. The P layer 78 is then heat treated in the same manner as that described for layer 70 and the target positioner and mask positioner place targets for a conductor layer and cause a conductor layer 80 to be deposited and overlap and interconnect with first conductor layer 68 as illustrated in FIG. 11. With the completion of the depositing of conductor layer 80, the structure has now been built up and deposited to provide two N-P semiconductor junctions and this illustrates the interconnection of the materials and the relationship of the conductors to the semiconductor materials. If this is the last layer, conductor layer 80 is heat treated to improve electrical continuity between the metal and semiconductor. If these are not the last two layers, the last two layers are treated in this manner to improve electrical continuity between the last electrical conductor and the semiconductor on which the last electrical conductor is deposited. In application, more than two junctions will often be used and FIGS. 12, 13 and 14 illustrate adding of additional P layer 82, N layer 84 and conductor layer 86 to provide three N-P junctions. P semiconductor layer 82 and N semiconductor layer 84 are each heat treated in the same manner as those for the other layers.

If additional N-P junctions are desired, additional deposits can be made to build up additional junction structure. Once the desired number of layers have been deposited and heat treated as set forth, substrate 44 with the layers deposited thereon are removed from enclosure 26 and the device is cut or ground smooth at each end to provide flat and parallel surfaces 88 and 90 (see FIG. 2) that are polished after being cut and finally a non-conductive dielectric reflecting surface 92 is applied to surface 90 to complete the method of making the layered semiconductor laser diode.

I claim:

1. A method of making a layered semiconductor laser diode, comprising providing a semiconductor substrate, depositing a first layer of an electrical conductor on a portion of a surface of said semiconductor substrate by sputtering metal onto said semiconductor substrate, sputtering a layer of first semiconductor material over a portion of said first electrical conductor and a portion of said semiconductor substrate, heat treating said sputtered layer of first semiconductor material to improve crystallinity of said first semiconductor material, sputtering a layer of a second semiconductor material of a different type from said first semiconductor material over a portion of said first semiconductor material, heat treating said second semiconductor material to improve crystallinity of said second semiconductor material, and sputtering a second layer of an electrical conductor material over said second semiconductor material to form a laser junction with first and second electrical leads.

2. A method of making a layered semiconductor laser as set forth in claim 1, wherein additional layers of semiconductor materials are sputtered as layers over said conductors and semiconductor materials with like layers of semiconductor materials being interconnected by the sputtering process, by each layer of the semiconductor material being heat treated to improve crystallinity of the sputtered semiconductor material, and by sputtering an additional metal electrical conductor over each two layers of semiconductor materials and over a portion of the selected first or second conductor to form an interleaved elongated P-N junction with interleaved conductor layers.

3. A method of making a layered semiconductor laser device as set forth in claim 2, wherein the laser device is cut at opposite ends to form smooth surfaces, polishing each of said smooth surfaces, and mounting a nonconductive dielectric reflecting surface on one of said polished end surfaces.

4. A method of making a layered semiconductor laser as set forth in claim 3, and including the step of heat treating the last sputtered metal electrical conductor to improve electrical continuity between the last sputtered metal electrical conductor and the last sputtered semiconductor material layer.

5. A method of making a layered semiconductor laser as set forth in claim 2, and including the step of heat treating the last sputtered metal electrical conductor to improve electrical continuity between the last sputtered metal electrical conductor and the last sputtered semiconductor material layer.

* * * * *